US007567197B2

(12) United States Patent
Lee et al.

(10) Patent No.: US 7,567,197 B2
(45) Date of Patent: Jul. 28, 2009

(54) CASCADE COMPARATOR AND CONTROL METHOD THEREOF

(75) Inventors: Jung-ho Lee, Gunpo-si (KR); Hong-rak Son, Hwaseong-si (KR); Jung-eun Lee, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 12/104,878

(22) Filed: Apr. 17, 2008

(65) Prior Publication Data

US 2009/0073021 A1    Mar. 19, 2009

Related U.S. Application Data

(60) Provisional application No. 60/972,848, filed on Sep. 17, 2007.

(30) Foreign Application Priority Data

Nov. 20, 2007    (KR)    ........................ 10-2007-0118655

(51) Int. Cl.
*H03M 1/38* (2006.01)
(52) U.S. Cl. .......................... 341/161; 327/75
(58) Field of Classification Search .......... 341/150–165, 341/75, 117, 202, 126, 551, 552
See application file for complete search history.

(56) References Cited

U.S. PATENT DOCUMENTS 3,735,264 A * 5/1973 Mauduech .................. 375/243
4,542,370 A * 9/1985 Yamada et al. ............. 341/133
4,962,323 A * 10/1990 Ta ............................. 327/97
5,227,678 A * 7/1993 Han et al. .................. 340/146.2
5,550,515 A * 8/1996 Liang et al. ................ 331/11
5,623,220 A * 4/1997 Betti et al. ................. 327/79
6,456,214 B1 * 9/2002 van der Wagt .............. 341/133
6,583,747 B1    6/2003 van der Goes et al.
6,674,389 B2 * 1/2004 Bult .......................... 341/159
6,819,166 B1 * 11/2004 Choi et al. .................. 327/551
7,183,962 B1 * 2/2007 Roo et al. ................... 341/155
7,271,632 B2 * 9/2007 Cottin et al. ................ 327/131
7,330,145 B2 * 2/2008 Van Der Ploeg ............ 341/161
2001/0007443 A1    7/2001 Ono
2001/0040522 A1    11/2001 Kobayashi et al.
2006/0066466 A1    3/2006 Pan

FOREIGN PATENT DOCUMENTS

JP    60172824 A    9/1985
JP    64016123 A    1/1989

* cited by examiner

*Primary Examiner*—Lam T Mai
(74) *Attorney, Agent, or Firm*—Sughrue Mion, PLLC

(57) ABSTRACT

A cascade comparator and a control method thereof are provided. By applying multi-phase clock signals to a plurality of comparators when the plurality of comparators are cascaded together so that each comparator is regenerated before the preceding comparator is reset, a hold switch does not need to be provided between the comparators. Therefore, it is possible to reduce the size and parasitic components of a circuit, operate the circuit at a high speed, remove a glitch caused by any hold switch, and accordingly improve system linearity.

10 Claims, 4 Drawing Sheets

CASCADE COMPARATOR AND CONTROL METHOD THEREOF

CROSS REFERENCE TO RELATED APPLICATIONS

This application claims priority from U.S. Provisional Patent Application No. 60/972,848, filed on Sep. 17, 2007, and Korean Patent Application No. 10-2007-0118655, filed on Nov. 20, 2007, the disclosures of which are incorporated herein in their entireties by reference.

BACKGROUND OF THE INVENTION

1. Field of the Invention

Apparatuses and methods consistent with the present invention relate to a comparator and a control method thereof, and more particularly, to a cascade comparator for use in an analog-to-digital converter (ADC), from which a hold switch for storing the output result of a comparator stage is removed, and a control method thereof.

2. Description of the Related Art

A comparator is a device which compares an input signal with a reference signal and outputs the comparison result. The comparator is generally used in an analog-to-digital converter (ADC) for converting analog signals into digital signals. For example, a comparator can be used in an ADC in such a manner that the comparator compares a sampled analog voltage with a reference signal to output a value "1" if the sampled analog voltage is higher than the reference voltage and output a value "0" if the sampled analog voltage is lower than the reference voltage.

Examples of such an ADC include a flash ADC, a successive approximation ADC, and an integrating ADC. The flash ADC among the above-mentioned ADCs has been widely used in recent times because it converts small-sized units of data while being able to perform a high-speed operation. The flash ADC performs analog-to-digital conversion by comparing an analog input signal with reference voltages which have been divided by several resistor ladders.

A one-stage comparator can be used according to the number of bits that are to be converted. However, in this case, there is a problem in that a bit error rate (BER) of the corresponding system becomes high when a sample clock period is short. For this reason, related art systems use a multi-stage cascade comparator. The term "cascade connection" means a multi-stage amplification method wherein a plurality of four-terminal devices are sequentially connected in a such a manner as to connect the output terminals of a four-terminal device to the input terminals of the following four-terminal device. By cascading a plurality of comparators together, it is possible to increase regeneration gains and reduce the probability that signals will transit to a meta-stable state.

When a plurality of comparators are cascaded together, the output of a comparator stage needs to be maintained at a constant level and then transferred to an input terminal of the next comparator stage. This is because, in the case of a multi-stage comparator, comparator stages included in the multi-stage comparator sequentially operate according to the phases of clock signals which the comparator stages receive respectively, and each comparator stage enters a reset state when the next comparator stage begins operation. If one comparator stage enters a reset state, the next comparator stage also successively enters a reset state and an input voltage of the next comparator stage changes, so that the reliability of output data cannot be guaranteed after it passes through a plurality of comparator stages.

In order to solve the problem, a method of holding an input level of a signal constant by providing a hold switch between comparator stages is used in the related art. In this method, the hold switch is turned on while one comparator stage operates, to charge an output voltage of the comparator stage in a parasitic capacitor of the next comparator stage, and the next comparator stage operates using the voltage stored in the parasitic capacitor when the hold switch is turned off, so that the resetting of the comparator stage does not affect the next comparator stage and accordingly stable cascading is made possible.

In other words, since the output of each comparator stage needs to be maintained at the same value as the sampled input value of a signal when a plurality of comparator stages are cascaded together, a hold switch for storing the output of a comparator stage is provided so that an input of the next comparator stage can be maintained regardless of a subsequent change in the output of the preceding comparator stage.

However, inclusion of the hold switch unnecessarily increases the size of a circuit. Since an increase in size of a circuit increases the number of parasitic components, power consumption increases, particularly when the circuit is a high-speed operating circuit (for example, a high-speed ADC). Also, the hold switch may deteriorate the performance of a system because a glitch caused by the hold switch may interfere with the linear operation of the circuit.

SUMMARY OF THE INVENTION

The present invention provides a cascade comparator, which appropriately adjusts clock signals that are applied to comparator stages included in the cascade comparator so that the regeneration phases of the comparator stages partially overlap each other, thereby reducing the size of a circuit, parasitic components, and non-linear components, without providing a hold switch between the comparator stages, and a method for controlling the cascade comparator.

Additional aspects of the invention will be set forth in the description which follows, and will in part be apparent from the description, or may be learned by practice of the invention.

According to an aspect of the present invention, there is provided a cascade comparator including: a plurality of comparing units comparing two input signals with each other, and amplifying a difference between the two input signals to output a differential signal, the plurality of comparing units connected with each other in a cascade structure; and a clock generator applying a plurality of clock signals respectively to the plurality of comparing units, independently adjusting a start time of reset phases and regeneration phases of the plurality of comparing units, and generating two or more clock signals so that the regeneration phases of the plurality of comparing units sequentially occur while partially overlapping each other.

The clock generator applies a first clock signal to a preceding comparing unit and applies a second clock signal partially overlapping the first clock signal to a subsequent comparing unit which is connected to the preceding comparing unit so that the subsequent comparing unit enters the regeneration phase before the preceding comparing unit is reset.

The plurality of comparing units include: a first comparing unit including a pre-amplifier and a regeneration amplifier, and repeatedly performing a reset operation and a regeneration operation at regular intervals; and a second comparing unit connected after the first comparing unit, and activated while the regeneration amplifier operates.

The second comparing unit includes: a pre-charge unit storing an output of the first comparing unit; and a cross-coupled inverter connected to the pre-charge unit, and maintaining an output of the second comparing unit.

The cascade comparator is used in a high-speed analog-to-digital converter (ADC).

According to another aspect of the present invention, there is provided a method of controlling a cascade comparator, the cascade comparator including a plurality of comparing units comparing two input signals with each other, amplifying a difference between the two input signals to output a differential signal, and repeatedly performing a reset operation and a regeneration operation at regular intervals according to a clock signal, the method including: generating a first clock signal and applying the first clock signal to a first comparing unit; and generating a second clock signal that partially overlaps the first clock signal and applying the second clock signal to the second comparing unit so that the second comparing unit is regenerated before the first comparing unit is reset.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the aspects of the invention.

DETAILED DESCRIPTION OF EXEMPLARY EMBODIMENTS

Figure 1:
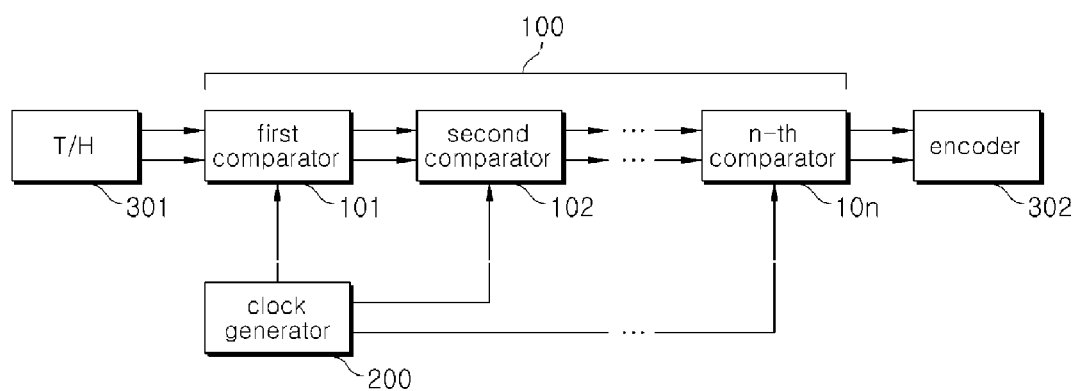
FIG. 1 is a block diagram of a cascade comparator according to an exemplary embodiment of the present invention.

The invention is described more fully hereinafter with reference to the accompanying drawings, in which exemplary embodiments of the invention are shown. This invention may, however, be embodied in many different forms and should not be construed as being limited to the exemplary embodiments set forth herein. Rather, these exemplary embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

FIG. 1 is a block diagram of a cascade comparator according to an exemplary embodiment of the present invention. The cascade comparator illustrated in FIG. 1 is used as a component of a high-speed ADC. Referring to FIG. 1, the cascade comparator includes a plurality of comparator stages 100, and a clock generator 200 for applying clock signals to the plurality of comparator stages 100. By providing a track/hold (T/H) switch 301 in front of the comparator stages 100, and an encoder 302 after the comparator stages 100, the cascade comparator can be used as a converter for converting analog signals into digital signals.

The comparator stages 100 have a cascade structure of n comparator stages which include a first comparator stage 101, a second comparator stage 102, ..., an n-th comparator stage 10$n$, as illustrated in FIG. 1. Each of the first through n-th comparator stages 101, 102, ..., 10$n$ compares two input signals with each other, amplifies a difference between the two input signals, and outputs a differential signal. For example, each of the first through n-th comparator stages 101, 102, ..., 10$n$ compares a received voltage with a reference voltage, and outputs a differential voltage corresponding to a difference between the received voltage and the reference voltage. The differential voltage is used as an input signal of the next comparator stage.

The clock generator 200 applies predetermined clock signals to the first through n-th comparator stages 101, 102, ..., 10$n$, and independently adjusts a start time of reset phases and regeneration phases of the first through n-th comparator stages 101, 102, ..., 10$n$. In the reset phase, a reset operation is performed in which, after a signal is transferred to the input of an amplifier or a comparator, the input signal is amplified by a gain of the amplifier or comparator thus generating an amplified output signal. If a reset switch at an output terminal of the amplifier or comparator is turned on to connect two output terminals of the amplifier or comparator, a voltage difference between the output terminals may be smaller than the gain of the amplifier or comparator. In the regeneration phase, a regeneration operation is performed in which a small voltage difference at an output terminal is greatly amplified by positive feedback of a regeneration amplifier. Accordingly, each of the comparator stages 101, 102, ..., 10$n$ applies its output to the next comparator stage, while being changed from the reset phase to the regeneration phase or from the regeneration phase to the reset phase, at regular intervals, according to a clock signal of the clock generator 200.

The clock generator 200 generates at least two clock signals so that the comparator stages 101, 102, ..., 10$n$ sequentially enter into respective regeneration phases such that the regeneration phases partially overlap each other, and applies the clock signals respectively to the respective comparator stages 101, 102, ..., 10$n$. For example, the clock generator 200 generates a second clock signal such that it partially overlaps a first clock signal which is applied to the first comparator stage 101, and applies the second clock signal to the second comparator stage 102, so that the second comparator 102 performs a regeneration operation before the first comparator 101 is reset. The second clock signal is slightly delayed from the first clock signal.

As described above, by using multi-phase clock signals to control the comparator stages 101, 102, ..., 10$n$, the regeneration periods of the comparator stages 101, 102, ..., 10$n$ partially overlap so that no hold switch is needed between the comparator stages 101, 102, ..., 10$n$.

Figure 2:
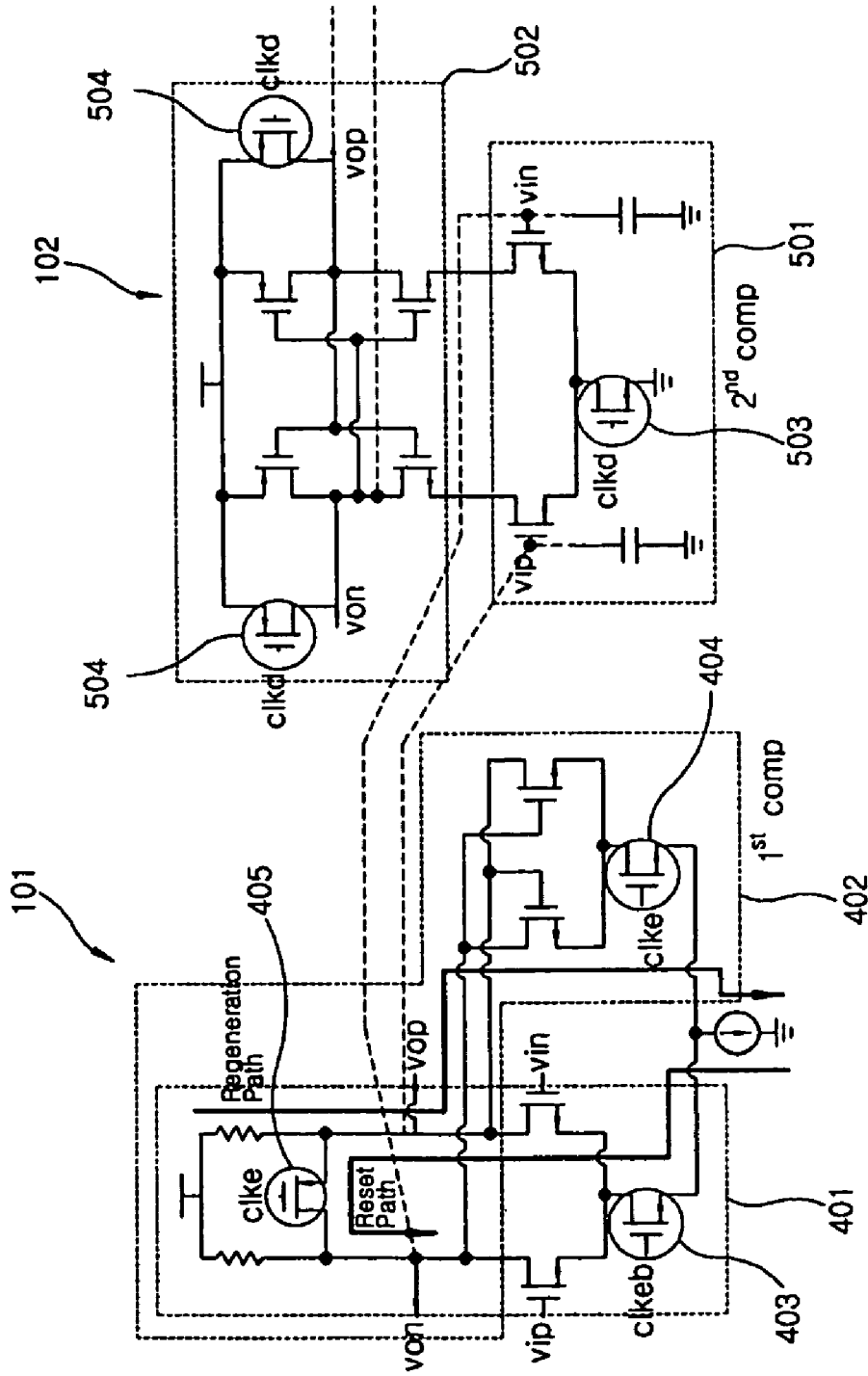
FIG. 2 is a circuit diagram of comparator stages included in the cascade comparator illustrated in FIG. 1, according to an exemplary embodiment of the present invention.
Figure 3:
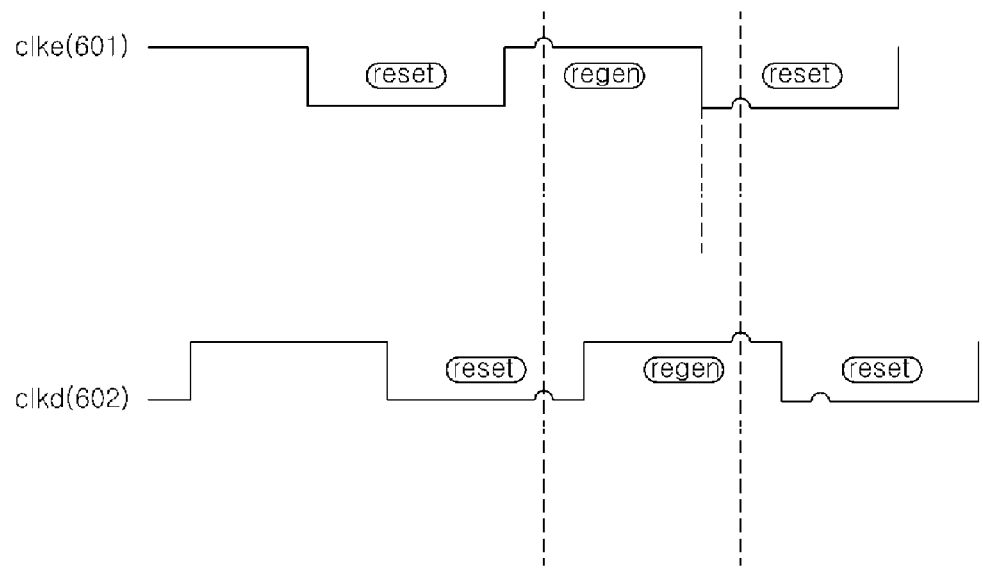
FIG. 3 is a view showing clock signals which partially overlap each other according to an exemplary embodiment of the present invention.

FIG. 2 is a circuit diagram of the first and second comparator stages 101 and 102 included in the cascade comparator illustrated in FIG. 1, according to an exemplary embodiment of the present invention, and FIG. 3 is a view showing clock signals which are generated by the clock generator 200, according to an exemplary embodiment of the present invention.

Although only the first and second comparator stages 101 and 102 are illustrated in FIG. 2, another comparator stage having the same configuration as that of the second comparator stage 102 may be connected after the second comparator stage 102. In FIG. 2, "vip" and "vin" represent input signals (for example, input voltages), and "vop" and "von" represent output signals (for example, output voltages). Since the first comparator stage 101 and the second comparator stage 102 are cascaded together, the output signal of the first comparator stage 101 is used as an input signal of the second comparator stage 102.

The first comparator stage 101 includes a pre-amplifier 401 constructed by connecting n-type or p-type MOS transistors to each other, and a regeneration amplifier 402. A first clock signal clke 601 (see FIG. 3) is applied to an NMOS transistor 404 of the first comparator stage 101. Since the polarity of an inverse clock signal clkeb applied to an NMOS transistor 403 of the pre-amplifier 401 is inverse to the first clock signal clke 601 applied to the NMOS transistor 404 of the regeneration amplifier 402, and since a path conversion switch 405 is located on a path between the NMOS transistor 403 and the NMOS transistor 404, the pre-amplifier 401 and the regeneration amplifier 402 alternately operate according to the first clock signal clke 601. Since the path conversion switch 405 is turned on while the pre-amplifier 401 operates, a reset operation is performed along a reset path. The path conversion switch 405 is turned off while the regeneration amplifier 402 operates, and a regeneration operation is performed along a regeneration path.

Examples of operations performed in the reset and regeneration phases are as follows. In the reset phase, if the first clock signal clke is low, the path conversion switch 405 is turned on so that the pre-amplifier 401 is turned on and the regeneration amplifier 402 is turned off. When the first clock signal clke 601 is low, the inverse clock signal clkeb of the first clock signal clke 601 goes high and is applied likewise in a manner described in the following descriptions. The pre-amplifier 401 amplifies a voltage difference vip-vin between the input voltages vip and vin, and outputs a small voltage difference vop-von through its output terminal. Then, in the regeneration phase, if the first clock signal clke 601 goes high and the inverse clock signal clkeb goes low, the path conversion switch 405 is turned off, and the voltage difference vop-von generated in the reset phase is again amplified by a gain of the regeneration amplifier 402, and outputted as a differential signal.

The second comparator stage 102 is connected after the first comparator stage 101, and activated while the regeneration amplifier 402 operates. Also, the second comparator stage 102 includes a pre-charge unit 501 which charges the output of the first comparator stage 101, and a cross-coupled inverter 502 which is connected to the pre-charge unit 501 and maintains the output of the second comparator stage 102. By forming a switch 503 of the pre-charge unit 501 and a switch 504 of the cross-coupled inverter 502 using different types of transistors, a pre-charge operation and a regeneration operation can be repeated at regular intervals in response to a predetermined clock signal. Accordingly, the second comparator stage 102 may be a dynamic comparator.

In order to activate the second comparator stage 102 while the regeneration amplifier 402 of the first comparator stage 101 operates, first and second clock signals clke 601 and clkd 602 illustrated in FIG. 3 are applied. Referring to FIG. 3, the first clock signal clke 601 is applied to the first comparator stage 101 and the second clock signal clkd 602 is applied to the second comparator stage 102. The second clock signal clkd 602 is slightly delayed from the first clock signal clke 601.

If the first and second clock signals clke 601 and clkd 602 illustrated in FIG. 3 are applied respectively to the first and second comparator stages 101 and 102, since a regeneration clock signal is also applied to the second comparator stage 102 when the output of the first comparator stage 101 is applied as a differential input to the second comparator stage 102, the pre-charge switch 503 of the second comparator stage 102 is turned on and thus the second comparison stage 102 is activated to perform a regeneration operation. Also, since the second comparator stage 102 includes a cross-coupled inverter 502, the output of the second comparator stage 102 is maintained when the first comparator state 101 again returns to the reset state.

Figure 4:
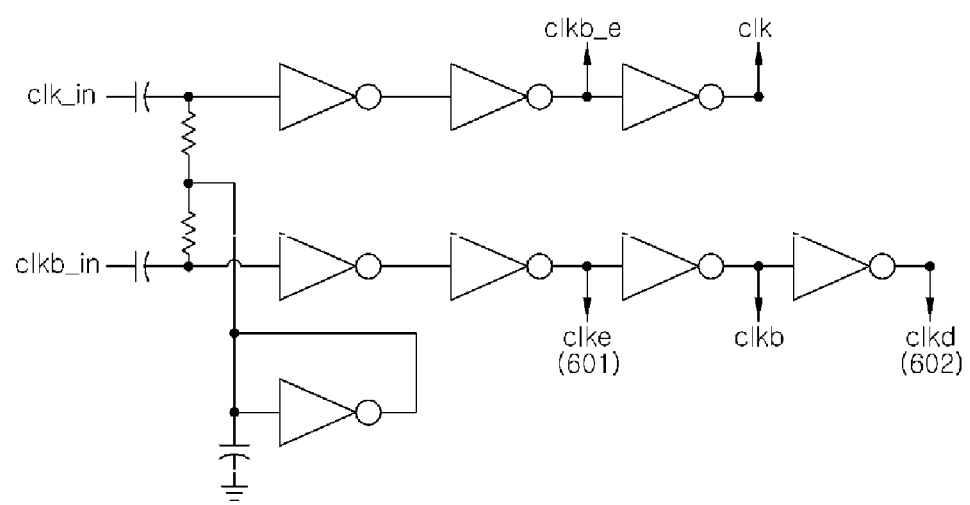
FIG. 4 is a circuit diagram of a clock generator according to an exemplary embodiment of the present invention.

FIG. 4 is a circuit diagram of a clock generator for generating multi-phase clock signals according to an exemplary embodiment of the present invention. As illustrated in FIG. 4, by passing a reference clock signal clk through an appropriate number of inverters, the first clock signal clke 601 and the second clock signal clkd 602 which is slightly delayed from the first clock signal clke 601 can be generated.

In contrast to the related art technique in which a hold switch is provided between two comparators and the output of a preceding comparator of the two comparators is disconnected from the input of the subsequent comparator using the hold switch so that the input of the subsequent comparator is maintained regardless of the resetting of the preceding comparator, according to an exemplary embodiment of the present invention, it is possible to maintain the input of a comparator without using a hold switch, regardless of the resetting of the preceding comparator, by appropriately adjusting clock signals so that the regeneration phase of the comparators partially overlap.

Figure 5:
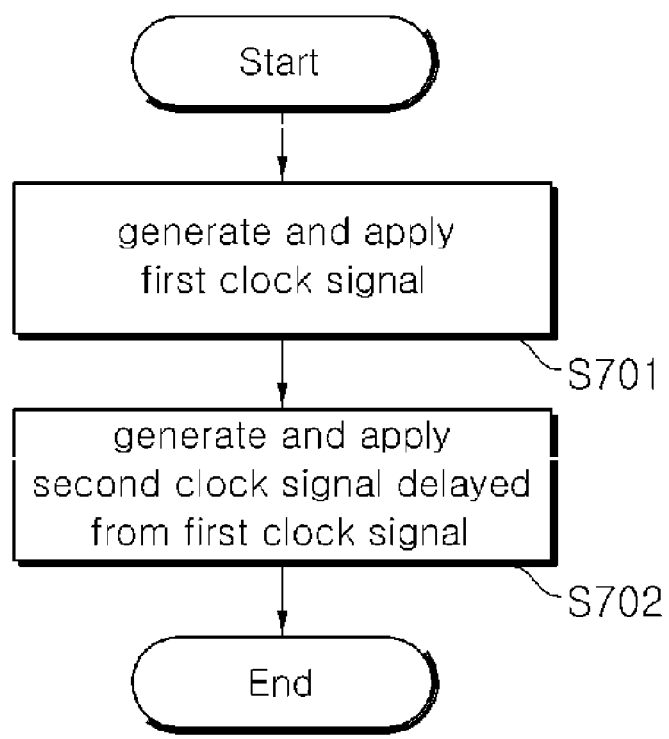
FIG. 5 is a flowchart of a control method of a cascade comparator according to an exemplary embodiment of the present invention.

FIG. 5 is a flowchart of a control method of the cascade comparator, according to an exemplary embodiment of the present invention.

According to an exemplary embodiment of the present invention, it is assumed that the control method is performed by the above-described cascade comparator. As described above, the cascade comparator has a structure wherein a plurality of comparator stages are connected to each other, allowing the cascade comparator to compare two input signals to each other, amplify a difference between the two input signals, output a differential signal, and repeatedly perform a reset operation and a regeneration operation at regular intervals according to a clock signal. In the cascade comparator, the first comparator stage 101 of FIG. 2 is used as a preceding comparator, and the second comparator stage 102 is used as the subsequent comparator, for example.

Now, the control method of the cascade comparator will be described. First, a first clock signal clke 601, as illustrated in FIG. 3, is generated and applied to the first comparator stage 101 (operation S701). The first clock signal clke 601 may be a pulse signal which goes from low to high or from high to low at regular intervals. As described above, the first comparator stage 101 performs a reset operation and a regeneration operation according to the first clock signal clke 601. For example, the first comparator stage 101 performs a reset operation when the first clock signal clke 601 is low, and performs a regeneration operation when the first clock signal clke 601 is high. Next, a second clock signal clkd 602, as illustrated in FIG. 3, is generated and applied to the second comparator stage 102 (operation S702). The second clock signal clkd 602 partially overlaps the first clock signal clke 601 (for example, a signal slightly delayed from the first clock signal) so that the second comparator stage 102 performs a regeneration operation before the first comparator stage 101 performs a reset operation. Likewise, when three or more comparator stages are connected to each other, by applying a signal, delayed by a predetermined interval from a clock signal that is applied to a preceding comparator stage, to a subsequent comparator stage, it is possible to regenerate the subsequent comparator stage before the preceding comparator stage is reset.

By generating multi-phase clock signals and by partially overlapping regeneration phases when a plurality of comparator stages are cascaded together, it is possible to reduce the size and parasitic components of a circuit and operate the circuit at a high speed, without using a hold switch.

Also, since a separate driver for driving a hold switch is not needed, power consumption can be reduced. In particular, since a glitch, which is generated by the hold switch and may affect the output of the preceding stage and the input of the subsequent stage, can be removed, linearity can be improved.

It will be apparent to those skilled in the art that various modifications and variations can be made in the present invention without departing from the spirit or scope of the invention. Thus, it is intended that the present invention includes the modifications and variations of this invention provided they come within the scope of the appended claims and their equivalents.

What is claimed is:

1. A cascade comparator comprising:
    a plurality of comparing units, wherein each comparing unit compares two input signals and amplifies a difference between the two input signals to output a differential signal, wherein the plurality of comparing units are connected in a cascade structure; and
    a clock generator which generates and applies a plurality of clock signals respectively to the plurality of comparing units, and independently adjusts a start time of reset phases and regeneration phases of the plurality of comparing units so that the regeneration phases of the plurality of comparing units sequentially occur while partially overlapping each other.

2. The cascade comparator of claim 1, wherein the clock generator applies a first clock signal to a preceding comparing unit and applies a second clock signal partially overlapping the first clock signal to a subsequent comparing unit which is connected to the preceding comparing unit so that the subsequent comparing unit enters the regeneration phase before the preceding comparing unit enters the reset phase.

3. The cascade comparator of claim 1, wherein the plurality of comparing units comprise:
    a first comparing unit comprising a pre-amplifier and a regeneration amplifier, wherein said first comparing unit repeatedly performs the reset operation and the regeneration operation at regular intervals; and
    a second comparing unit which follows the first comparing unit in the cascade structure, wherein the second comparing unit is activated while the regeneration amplifier operates.

4. The cascade comparator of claim 3, wherein the second comparing unit comprises:
    a pre-charge unit which stores an output of the first comparing unit; and
    a cross-coupled inverter which is connected to the pre-charge unit, and maintains an output of the second comparing unit.

5. The cascade comparator of claim 3, wherein the second comparing unit comprises a plurality of dynamic comparators that are repeatedly pre-charged and regenerated at regular intervals.

6. The cascade comparator of claim 1, wherein each comparing unit amplifies an input voltage and outputs a differential voltage.

7. A high-speed analog-to-digital converter (ADC) comprising the cascade comparator of claim 1.

8. A method of controlling a cascade comparator, the cascade comparator including a plurality of comparing units, wherein each comparing unit compares two input signals, amplifies a difference between the two input signals to output a differential signal, and repeatedly performs a reset operation and a regeneration operation at regular intervals according to a clock signal, the method comprising:
    generating a first clock signal and applying the first clock signal to a first comparing unit; and
    generating a second clock signal that partially overlaps the first clock signal and applying the second clock signal to a second comparing unit so that the second comparing unit performs the regeneration operation before the first comparing unit performs the reset operation.

9. The method of claim 8, wherein the first comparing unit includes a pre-amplifier and a regeneration amplifier, and repeatedly performs the reset operation and the regeneration operation according to the first clock signal.

10. The method of claim 8, wherein the second comparing unit comprises:
    a pre-charge unit which stores an output of the first comparing unit; and
    a cross-coupled inverter connected to the pre-charge unit which maintains an output of the second comparing unit.

* * * * *